United States Patent [19]

Wilks

[11] Patent Number: 4,550,494
[45] Date of Patent: Nov. 5, 1985

[54] AUTOMATED PRINTED CIRCUIT BOARD ASSEMBLY METHOD

[75] Inventor: Robert S. Wilks, Plum Borough, Pa.

[73] Assignee: Westinghouse Electric Corp., Pittsburgh, Pa.

[21] Appl. No.: 623,681

[22] Filed: Jun. 22, 1984

[51] Int. Cl.$^4$ ............................................. H05K 3/30
[52] U.S. Cl. ...................................... 29/838; 29/741;
140/105; 227/77; 227/113; 227/155
[58] Field of Search ................. 29/838, 837, 834, 739,
29/741, 744; 140/105, 106; 227/77, 113, 155

[56] References Cited

U.S. PATENT DOCUMENTS

| | | |
|---|---|---|
| 3,429,170 | 2/1969 | Romeo . |
| 3,439,416 | 4/1969 | Yando . |
| 3,550,238 | 12/1970 | Allen et al. ........................ 29/741 X |
| 3,624,676 | 11/1971 | Whitney . |
| 3,673,665 | 7/1972 | Kindell et al. . |
| 3,893,232 | 7/1975 | Fletcher et al. . |
| 4,125,136 | 11/1978 | Olcese et al. ....................... 29/741 X |
| 4,283,847 | 8/1981 | May . |
| 4,449,661 | 5/1984 | Spehrley, Jr. ....................... 227/155 |

FOREIGN PATENT DOCUMENTS 2021029 11/1979 United Kingdom ................ 227/155

*Primary Examiner*—Howard N. Goldberg
*Assistant Examiner*—Carl J. Arbes
*Attorney, Agent, or Firm*—E. C. Arenz

[57] ABSTRACT

The method of assembling lead-mounted electric components such as DIP 18 in automated fashion to a printed circuit board 14 is accomplished by building up a crimping tool (FIG. 7) comprising a base 28 with crimping anvils 12, 20, 22, 24, by selectively positioning and orienting the anvils on the base while the base is energized to provide a moderately low strength field, and the base is then energized to provide an adequately high strength magnetic field to retain the anvils properly during the subsequent steps of mounting the components to the board and crimping the leads to produce a particular type of board. After the requisite number of boards of a particular type are built, the anvils are removed to storage and the base is rebuilt to provide a different array of anvils for a different board.

4 Claims, 9 Drawing Figures

AUTOMATED PRINTED CIRCUIT BOARD ASSEMBLY METHOD

BACKGROUND OF THE INVENTION

One conventional way to secure lead-mounted electrical components to a printed circuit board after inserting the leads through the holes in the board and before soldering is to bend the leads out or in slightly to secure the component to the board. This is done by backing up the board with a special tooling plate which has a number of crimping anvils pinned and screwed to the surface of the plate with the anvils arranged on the plate in the same pattern or array as the pattern or array of the components which are to be secured to the board.

This conventional lead-crimping operation is illustrated in FIGS. 1 and 1A in which the lead-mounted component is shown with the leads being inserted through the board holes in FIG. 1, and with the leads being bent outwardly slightly at their ends by the anvil as shown in FIG. 1A. The result is, of course, to lock the component to the board.

This lead-crimping operation is typically done with automated insertion machinery such as by a robotic manipulator of one type or another located at the work station. The operations as presently employed when the components are inserted by robots have what I consider to be a number of disadvantages, among which are that a crimping fixture must be designed, built, inspected, stored, and inventoried for every different printed circuit board made. Furthermore, to change over the production line to build a different board it is necessary to locate and withdraw the desired fixture from storage, inspect it for damage, bring it to the insertion machinery at the correct time, and shut the machine down while the no-longer-needed particular crimping tool with one particular array is removed, and the new one is installed and its alignment checked. Finally, the earlier used crimping tool must be returned to storage and the transfer of all tooling noted in the inventory records.

It is the aim of my invention to provide an automatic printed circuit board assembly method in which at least some of the disadvantages noted heretofore are avoided.

SUMMARY OF THE INVENTION

In accordance with the invention, there is provided a method of assembling, in automated fashion, lead-mounted electric components to printed circuit boards in which the method comprises stationing a magnetic, field-controllable base, adapted to receive a plurality of ferromagnetic lead-crimping anvils thereon, within the working envelope of a robotic manipulator, controlling the magnetic, field-controllable base to provide a moderately low strength magnetic field, selectively positioning and orienting the crimping anvils on the base in an array to completely accommodate the leads of all the lead-mounted electrical components to be crimped for a given circuit board, increasing the field strength of the base to provide an adequately high strength magnetic field to ensure retention of the anvils in the proper locations and orientation during the subsequent steps of mounting the components to the board and crimping the leads to produce the given circuit board. The invention also contemplates that after the requisite number of boards of a given type have been produced, reducing the field strength to at least a degree that the field strength permits relatively easy removal of the anvils from the base and then removing the anvils, and then repeating the steps of replacing selected anvils on the base in a different array for a different type of circuit board.

DESCRIPTION OF THE PREFERRED EMBODIMENTS

Figure 1:
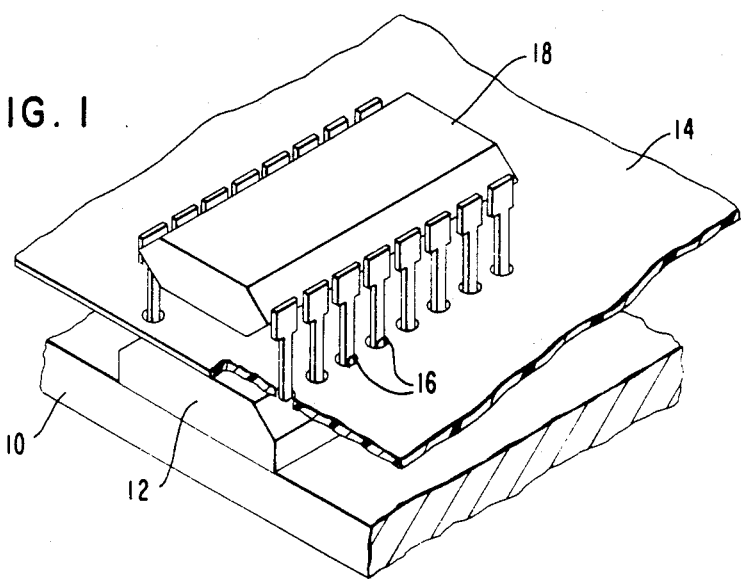
FIGS. 1 and 1A are fragmentary isometric views illustrating successive steps in applying a lead-mounted electric component to a printed circuit board and a crimping anvil to secure the component to the board.
Figure 1A:
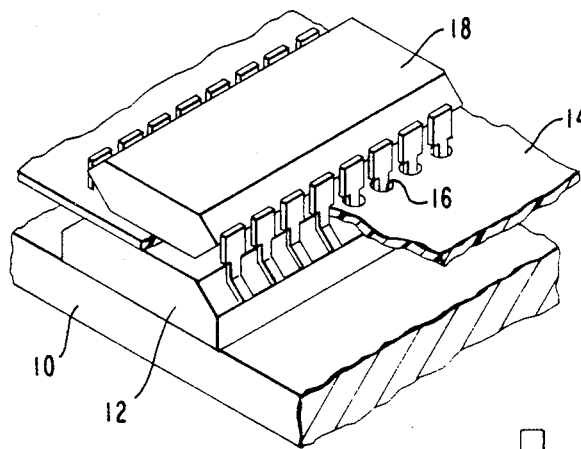
Figure 2:
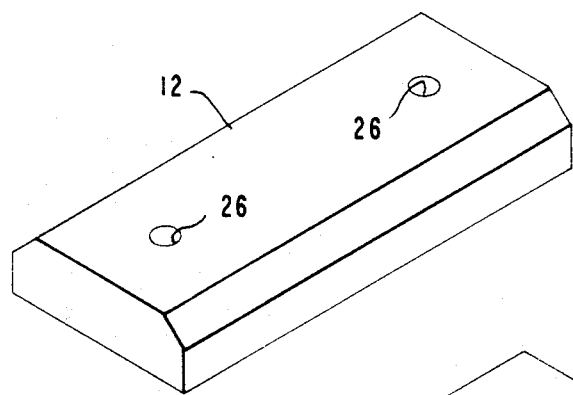
FIGS. 2-5 are isometric views of examples of crimping anvils which may be used in carrying out the invention.
Figure 3:
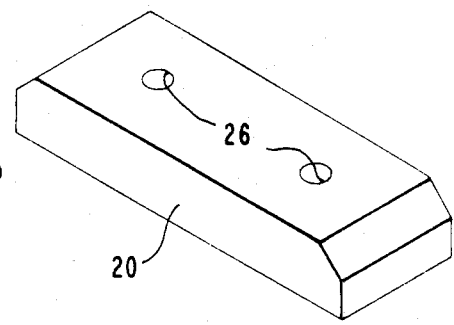
Figure 4:
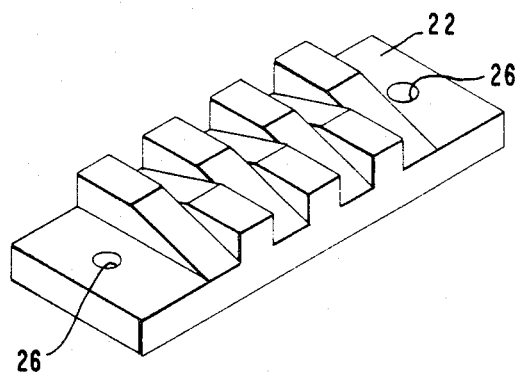
Figure 5:
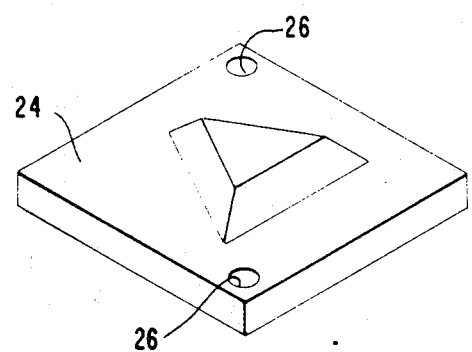

As illustrated in FIGS. 1 and 1A, a baseplate 10 supports a crimping anvil 12 and a printed circuit board 14 overlies the anvil with the holes 16 in the printed circuit board in registry with the opposite sloped faces of the anvil. In FIGS. 1 and 2, the lead-mounted component is a DIP 18 which is moved downwardly so that its leads encounter the sloped faces in FIG. 1 and are caused to be bent apart as shown in FIG. 1A with the leads fully inserted.

The anvils shown in FIGS. 2-5 are examples of types used for different lead-mounted components. FIG. 2 shows the anvil for a DIP, FIG. 3 the anvil 20 for a two-lead component, FIG. 4 the anvil 22 for a SIP and in FIG. 5 the anvil 24 for components with three triangularly disposed leads such as a TO-5 pack transistor. Each of the anvils are made of a ferromagnetic material and may optionally be provided with locating holes on their top surface as at 26 to promote locating and orienting the anvils by the robot. All the anvils have a common height.

Figure 6:
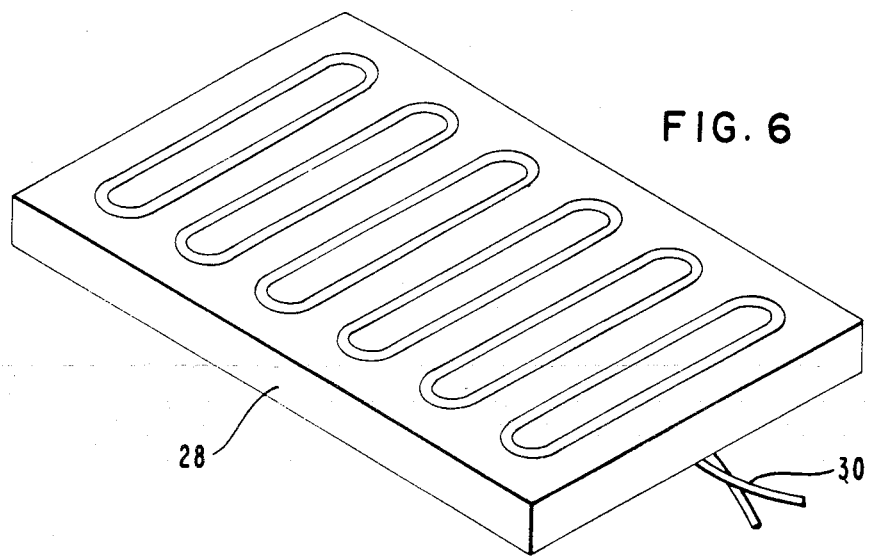
FIG. 6 is an isometric view of one form of magnetic base plate which may be used in the invention.

A baseplate 28 (FIG. 6) which has a controllable magnetic field is the base upon which the anvils will be arrayed in accordance with the invention. The currently preferred way of controlling the field strength is electrically as by energization through the leads 30, although mechanical magnetic control could also be used.

Figure 8:
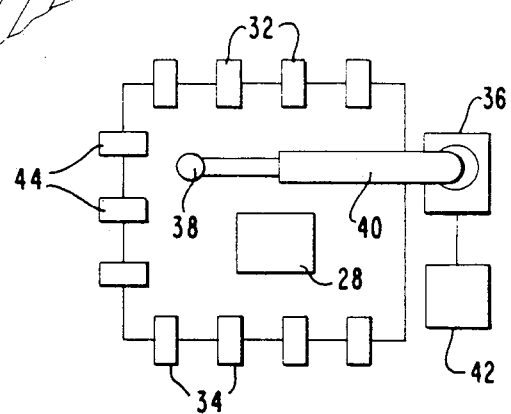
FIG. 8 is a somewhat schematic illustration of a work station for carrying out the invention.
Figure 7:
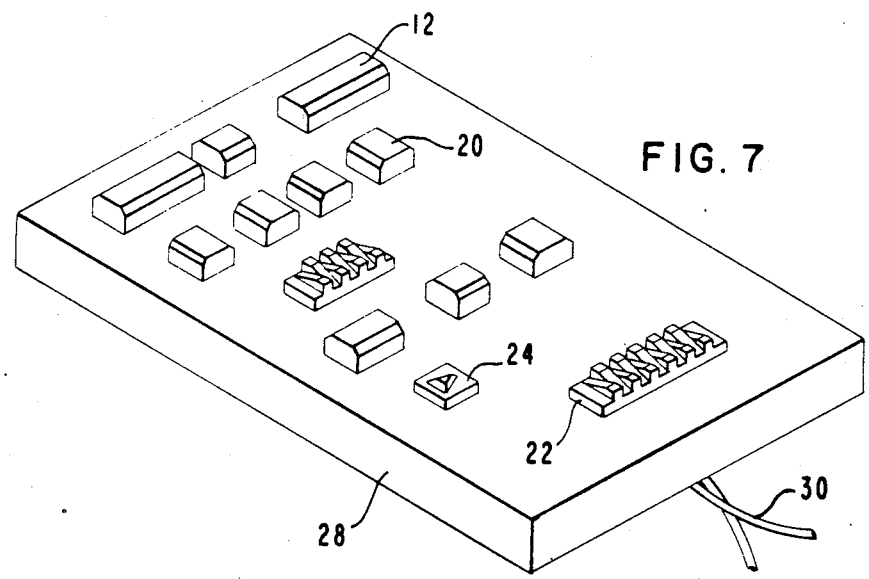
FIG. 7 illustrates a typical array of crimping anvils of the type shown in FIGS. 2-5 on the magnetic base.

FIG. 7 shows a typical array of various anvils located and oriented on the plate 28 to accord with the array of holes in whatever circuit board is being made so that the leads of the lead-mounted electrical components can be inserted through the holes of the circuit board and be crimped to the board by the correct anvil. This is done in an automated way at a work station as schematically illustrated in FIG. 8. The baseplate 28 is permanently installed at the station. A number of feeders 32 are provided at the station for dispensing various lead-mounted electrical components along with a number of storage containers 34 to store the different anvils when not in use. Magazines 44 for various printed circuit boards to be used are also provided at the station. A robotic manipulator 36, which may take any of various forms, includes hand means at the end of arm means 40 and is operated by the controller 42 provided with the proper software for the operations.

In carrying out the method of the invention, the magnetic field-controllable base 28 is permanently installed at the station. Assuming that the base 28 is electrically controlled, the base is energized to provide a moderately low strength magnetic field. The robot 36 then proceeds in accordance with its program to pick the anvils from the storage containers 34, one at a time, and proceed to deposit them on the base 28 in the positions and orientations according to the type of printed circuit board to be built. When all of the anvils are positioned, the energization to the base is increased to increase the field to an adequately high strength to insure the retention of the anvils at the proper locations and in proper orientations during the subsequent steps. The purpose of the reduced field strength during positioning is, of course, to reduce negative effects that the field could have on anvil positioning accuracy. The robot 36 first fetches the proper board and positions it correctly on the top of the anvils and then fetches the lead-mounted electrical components from the magazines 32, one at a time, and inserts the leads of the components through the holes in the printed circuit board to obtain the crimping action of the leads by the proper anvil. The ultimate array of components on the completed circuit board will, of course, correspond to the array of anvils on the base. The completed board is then removed and stored and successive boards of the same type are made until the requisite number have been produced with the given array.

The crimping tool built by the anvils upon the base 28 is then dismantled just as it was built, including weakening the magnetic field, and the anvils returned to their respective containers for re-use. Then, a new array of anvils upon the base is built for a different type of circuit board in the same way as has been described before.

Among the advantages considered to be attained by the invention are the following. The method is more amenable to "just-in-time" manufacturing boards than the prior art method described in the background of the invention. The design, machining and inspection of the prior art crimping tools is eliminated, along with the floor space to store one crimping tool per printed circuit board style. Manual changeover between styles is eliminated, along with subtle damage to tools from rough handling. Logistics and records required to keep track of tools and to get them to the machine on time are basically eliminated.

Since the array of anvils and components is the same, there is some commonality in the softward for the two different types of operations.

Anvil blocks are not likely to slip in use since frictional forces at the chucking base are surprisingly high. In addition, forces required to bend the leads are small and directed mostly vertically to the base. Furthermore, the anvil surfaces which bend the leads over can be arranged by design such that the lead bending force components parallel to the plate will resolve to zero (or nearly so) when the anvil block is correctly positioned with respect to the device being crimped.

I claim:

1. The method of assembling in automated fashion lead-mounted electric components to a printed circuit board, comprising:
    (a) stationing a magnetic field-controllable base, adapted to receive a plurality of lead-crimping anvils of ferromagnetic material thereon, within the working envelope of a robotic manipulator;
    (b) controlling said magnetic field-controllable base to provide a moderately low strength magnetic field;
    (c) selectively positioning and orienting said crimping anvils on said base in an array to completely accommodate the leads of all the lead-mounted electrical components to be crimped for a given circuit board;
    (d) increasing the field strength of said base to provide an adequately high strength field to ensure retention of said anvils in the proper location and orientation during subsequent steps; and
    (e) mounting said components to said board and crimping said leads to produce said given circuit board.

2. The method of claim 1 including:
    removing all circuit boards of said given type;
    reducing the field strength of said base to at least a degree that the field strength permits relatively easy removal of said anvils from said base after the desired number of boards of a particular type have been assembled;
    removing said anvils;
    repeating the steps of (b), (c), (d), (e) of claim 1, except for positioning and orienting said anvils to present a different array, to produce circuit boards of another particular type.

3. The method of claim 1 wherein:
    utilizing an electromagnetic, field-controllable element as said base; and
    controlling the electrical energization to said base to effect the control of the field strength of said base.

4. The method of providing a fixture for the automated assembly of a printed circuit board to which lead-mounted electric components are secured, comprising:
    (a) providing an electromagnetic, field-controllable base adapted to receive a plurality of ferromagnetic lead-crimping anvils thereon;
    (b) energizing said electromagnetic field-controllable base to provide a moderately low strength field;
    (c) selectively positioning and orienting said crimping anvils on said base in an array to completely accommodate leads of all the lead-mounted electrical components to be crimped for a given circuit board; and
    (d) increasing the energization of said base to provide an adequately high strength field to ensure retention of said anvils at the proper location and orientation during the subsequent steps of mounting said components to said board and crimping said leads to produce boards of said given type.

* * * * *